United States Patent
Gramegna

(10) Patent No.: US 7,129,793 B2
(45) Date of Patent: Oct. 31, 2006

(54) DEVICE FOR CALIBRATING THE FREQUENCY OF AN OSCILLATOR, PHASE LOOKED LOOP CIRCUIT COMPRISING SAID CALIBRATION DEVICE AND RELATED FREQUENCY CALIBRATION METHOD

(75) Inventor: Giuseppe Gramegna, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 62 days.

(21) Appl. No.: 11/024,327

(22) Filed: Dec. 28, 2004

(65) Prior Publication Data
US 2005/0156677 A1  Jul. 21, 2005

(30) Foreign Application Priority Data
Dec. 29, 2003  (EP) .................................. 03425828

(51) Int. Cl.
*H03L 7/00* (2006.01)
(52) U.S. Cl. ..................... 331/16; 331/1 A; 331/34; 331/177 R; 327/156; 327/159; 327/160
(58) Field of Classification Search ............... 331/16, 331/34, 177 R, 11, 1 A; 327/156, 159, 160
See application file for complete search history.

(56) References Cited

U.S. PATENT DOCUMENTS

| 5,382,922 | A | * | 1/1995 | Gersbach et al. ........... 331/1 A |
| 6,078,633 | A | | 6/2000 | Shiotsu et al. .............. 375/374 |
| 6,496,556 | B1 | * | 12/2002 | Huehne et al. ................ 377/2 |
| 6,522,206 | B1 | | 2/2003 | Kornblum et al. .......... 331/1 A |
| 6,566,966 | B1 | * | 5/2003 | Bellaouar et al. ............. 331/10 |
| 2003/0042985 | A1 | | 3/2003 | Shibahara et al. ............ 331/17 |
| 2003/0197564 | A1 | | 10/2003 | Humphreys et al. .......... 331/11 |

* cited by examiner

*Primary Examiner*—Arnold Kinkead
(74) *Attorney, Agent, or Firm*—Lisa K. Jorgenson; Robert Iannucci; Seed IP Law Group PLLC

(57) ABSTRACT

A device calibrates the frequency of an oscillator. The oscillator has first and second inputs and generates an output frequency responsive to a first voltage signal at the first input. The calibration device generates a calibration signal applied at the second input of the oscillator for calibrating its output frequency and comprises a counter. The counter has a first input frequency proportional to a reference frequency and a second input frequency proportional to the output frequency. The counter counts the time window number given by the ratio of the second to first frequencies. The device comprises a comparator that compares the counted time window number with a prefixed time window number. The calibration device changes the value of the calibration signal if the counted time window number is different from the prefixed time window number and until the counted time window number is equal to the prefixed time window number.

19 Claims, 2 Drawing Sheets

DEVICE FOR CALIBRATING THE FREQUENCY OF AN OSCILLATOR, PHASE LOOKED LOOP CIRCUIT COMPRISING SAID CALIBRATION DEVICE AND RELATED FREQUENCY CALIBRATION METHOD

BACKGROUND OF THE INVENTION

1. Field of the Invention

The present invention refers to a device for calibrating the frequency of an oscillator, to a phase looked loop circuit comprising said calibration device and to the related frequency calibration method.

2. Description of the Related Art

In the present radio communication systems phase looked loop circuits (PLL) are generally utilized for generating oscillating electric signals. Generally the PLLs comprise a voltage controlled oscillator (VCO) generation an oscillating output signal as a response of a voltage level applied at the input. The specific parameters of the voltage/frequency relationship depend on the parameters of the VCO manufacturing process, the values of the electric components that it comprises, the ambient temperature and the other factors.

For reducing the effects of the temperature variations and of the process parameters, devices for calibrating the frequency of the VCO are presently used.

Such devices become very important for the following reasons.

The reduction of the sizes of the integrated circuits which are due to the generation of MOS transistors having smaller and smaller channels imposes a reduction of the supply voltage and, for this reason, a reduction of the input voltage of the VCO.

The need of increasing the rejection of the spur radiation emissions in PLL and the risk of frequency variations of the VCO which are due to the interferences given by the coupling with the rest of the circuitry when a complex system is formed on a chip, imposes a reduction of the gain of the VCO.

A PLL having a device for calibrating a frequency of a VCO is disclosed in the article "A Fully Integrated PLL Frequency Synthesizer LSI for Mobile Communication System.", 2001 IEEE Radio Frequency Integrated Circuits Symposium, pages 65–68. The PLL device comprises a programmable divider, a phase comparator, a filter, a delta-sigma converter, a VCO and a frequency error detector. The frequency band of the VCO is selected by means of a digital control signal and the resonant circuit of the VCO has N frequency bands of operation. When new frequency data are sent to the PLL the VCO has an input constant voltage. As a response of a starting digital signal one among the N bands of the resonator circuit is selected and the VCO oscillates at a frequency f1 that is sent to the programmable divider having at the input the output signal of the sigma-delta converter; the output signal of the programmable divider is the signal fdiv. The error detector compares the frequency fdiv with a reference frequency fref and it generates a new digital signal for selecting another frequency band of the VCO. The process is iterated several times until the frequency difference between the signal fdiv and the signal fref becomes less than a prefixed value. When the corrected frequency band of the VCO has been determined, the VCO does not have any longer at the input the constant signal but the output signal of the filter so that the PLL acts in closed loop condition.

The precision of the frequency calibration in this device is due to the bit number of the digital signal; however the use of a digital signal with a large bit number increases the convergence time of the calibration method. It is therefore necessary a trade-off between the bit number of the digital signal and the convergence time of the calibration method.

BRIEF SUMMARY OF THE INVENTION

In view of the art described, it is an object to present invention to provide a device for calibrating the frequency of an oscillator which is more precise than the known devices and which has a small convergence time.

According to the present invention, this object is obtained by means of a device for calibrating the frequency of an oscillator, said oscillator having a first and a second input and generating an output frequency as a response to a first voltage signal applied at said first input, said calibration device being adapted to generate an output digital signal applied at said second input of the oscillator for calibrating its output frequency, characterized in that said calibration device comprises at least one counter, said counter having a first input frequency proportional to a reference frequency and a second input frequency proportional to the output frequency of the oscillator, said counter counting a time window number given by the ratio of the second to first frequency and said device comprising means adapted to compare said counted time window number with a prefixed time window number, said calibration device being adapted to change the value of said frequency calibration digital signal if said counted time window number is different from said prefixed time window number and until it is obtained that said counted time window number is equal to said prefixed time window number.

Still according to the present invention it is possible to provide to a phase looked loop circuit that includes such a calibration device.

Still in accordance with the present invention it is possible to provide a method for calibrating the frequency of an oscillator of a phase looked loop circuit.

Thanks to the present invention it is possible to provide a device for calibrating a frequency of an oscillator which allows the use of a VCO having a reduced voltage/frequency gain and a reduced input voltage level as required by the present radio communication systems.

BRIEF DESCRIPTION OF THE SEVERAL VIEWS OF THE DRAWINGS

The features and the advantages of the present invention will be made evident by the following detailed description of an embodiment thereof, shown as not limiting example in the annexed drawings, wherein.

DETAILED DESCRIPTION OF THE INVENTION

Figure 1:
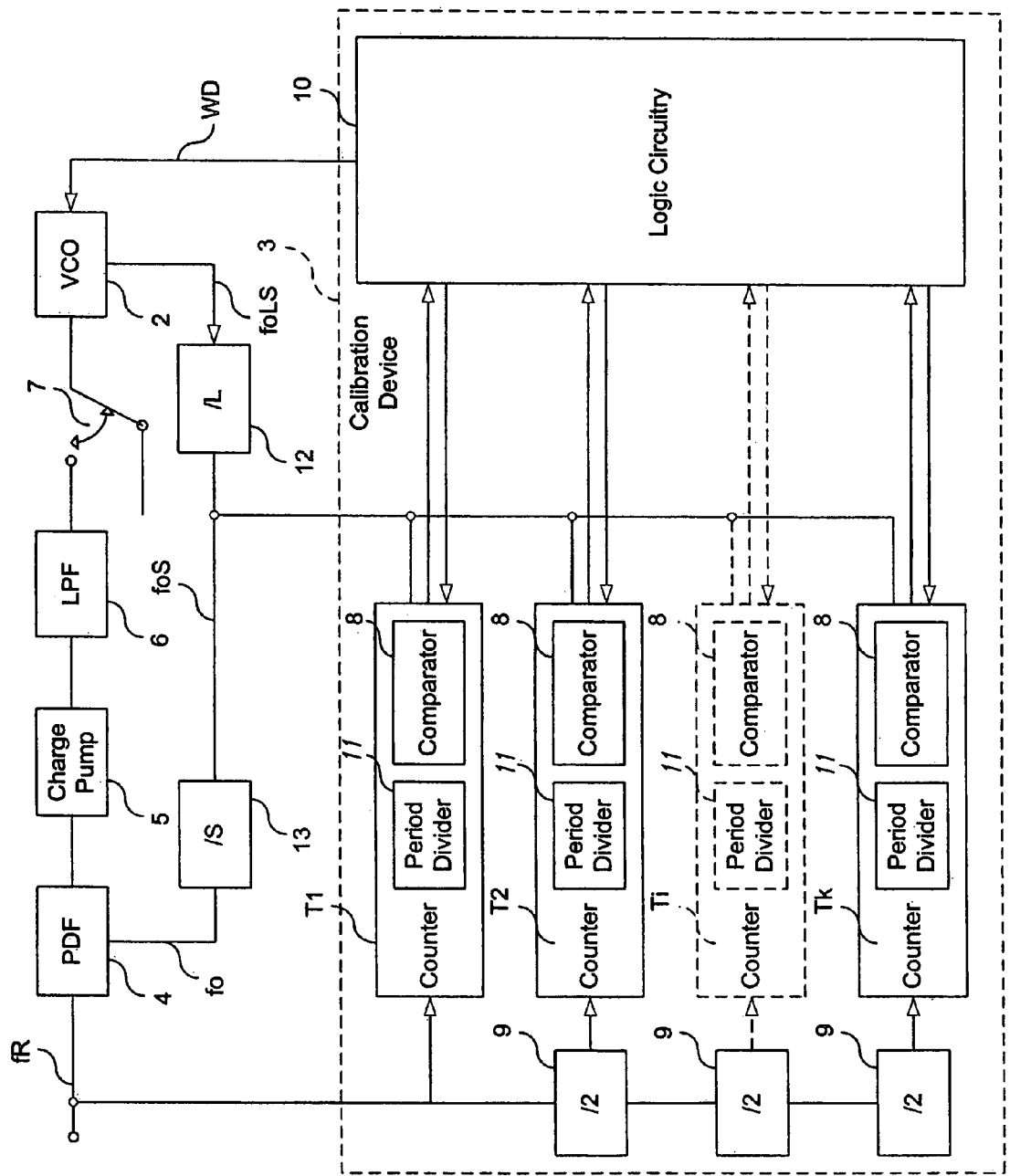
FIG. 1 is a schematic view of a phase looked loop circuit comprising a voltage controlled oscillator and a calibration device of the frequency of the oscillator according to the present invention.

With reference to FIG. 1 a phase-locked loop (PLL) 1 comprising a voltage-controlled oscillator (VCO) 2 and a device 3 for calibrating the frequency of the VCO 2 are shown. The PLL comprises a phase detector (PDF) 4 adapted to detect the phase difference between the input reference frequency fR and the frequency fo. The output voltage signal of the PDF 4 is sent to a charge pump 5 having an output signal that is filtered by a low-pass filter (LPF) 6. The VCO 2 can have as input voltage level either a reference voltage Vref or the output voltage signal of the filter LPF 6; in fact there is a switch 7 that can be connected with the reference voltage Vref or with the output voltage signal of the filter LPF.

The VCO 2 has an oscillating frequency given by L*S*fo that is calibrated by an output digital signal WD of the device 3.

The device 3 comprises at least one counter Ti having a first input frequency proportional to a reference frequency fR and a second input frequency S*fo proportional to the output frequency L*S*fo of the oscillator 2. The counter counts the time window number Fi given by the ratio of the second to first input frequency and it comprises means 8 adapted to compare said counted time window number Fi with a prefixed time window number Bi. The device 3 is adapted to change the value of the frequency calibration digital signal WD if said counted time window number Fi is different from said prefixed time window number Bi and until it is obtained that said counted time window number Fi is equal to said prefixed time window number Bi.

More precisely the device 3 comprises a first counter T1 and a second counter T2 which are placed in parallel to each other; the second counter T2 has a precision higher than the first counter T1 so that the prefixed time window number B1 for the first counter T1 is lower than the prefixed time window number B2 for the second counter. The first counter T1 has a reference frequency fR while the second counter has a reference frequency fR/2 provided by a divider 9. The first counter T1 and the second counter T2 count simultaneously first F1 and second F2 time window numbers given by the ratio of the frequency fo*S respectively by fR and by fR/2. The first and the second counters comprise means 8 adapted to compare said first number F1 and said second number F2 with the respective prefixed time window numbers B1, B2 and the device 3 is adapted to change the value of the digital signal WD if one between said time window numbers F1, F2 is different from the respective prefixed time window number B1, B2 and until it is obtained that both the first F1 and the second F2 time window numbers are equal to said prefixed time window numbers B1, B2 or, in a similar way, when it is obtained that only the second time window number F2 is equal to the respective prefixed time window number B2.

Still more precisely the device 3 comprises a plurality of counters T1–Tk adapted to count the frequency fo*S with a time window number given by $(fo*S/(fR/2^{i-1}))$ with i=1, ... k. All the counters T1–Tk are activated simultaneously and have as clock signal the signal 1/fo*S. Each counter comprises means 8 adapted to send a reset pulse to a logic circuitry 10 when the number Fi for counting the frequency fo*S is different from the value Bi given by $(fo*S/(fR/2^{i-1}))$ with i=1, ... k. where ft is the target frequency set by the outside in the logic circuitry 10 with ft=fR; the means 8 provide to reset the counter after having sent the reset pulse. Each counter T1 ... T comprises means 11 for setting the value Bi with i=1, ... k. for each counter T1 ... Tk as a function of the frequency ft provided by the circuitry 10.

It is also possible, alternatively, that the circuitry 10 comprises the means 11 so that the same computes and provides the values B1–Bk to each counter T1–Tk.

It is still possible, once again alternatively, that the circuitry 10 comprises the means 8 so that the same carries out the comparison between each value F1–Fk with the corresponding values B1–Bk; each one of the counters T1–Tk will provide the circuitry 10 only with the corresponding value Fi comprised among F1–Fk.

The means 8 can be constituted by comparators or by computer means and the means 11 are time period dividers.

The logic circuitry 10 provides to send the reset pulse received from any counter to the outer counters for resetting them. Also the logic circuitry 10 provides to decrease or to increase the output digital signal WD for at least one least significant bit (LSB) when it receives a reset pulse from any counter. The same circuitry 10 controls the switch 7 to connect with the voltage Vref during the frequency calibration process and to connect with the output signal of the filter LPF 6 at the end of the calibration process.

The PLL 1 further comprises a frequency divider 12 for obtaining a frequency fo*S from the input frequency fo*S*L and a second divider 13 for obtaining the frequency to from the input frequency fo*S.

Figure 2:
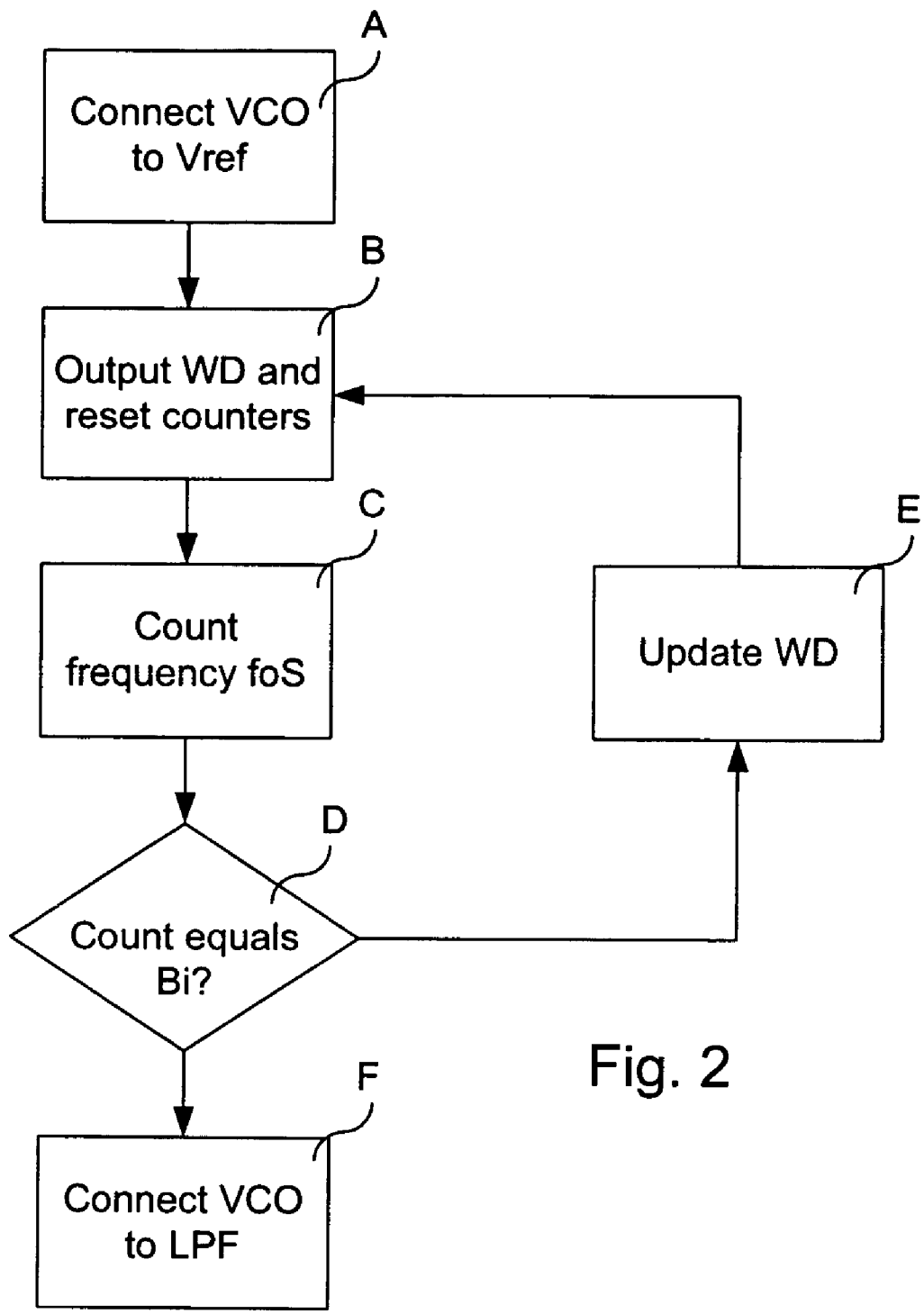
FIG. 2 is a flow diagram representing the method for calibrating the frequency of the oscillator in FIG. 1.

The frequency calibration apparatus operates in the following way, as shown in the diagram in FIG. 2.

At the starting step A the circuitry 10 sets the switch 7 to connect with the reference voltage Vref. At the step B the circuitry 10 sends the digital signal WD corresponding preferably to the highest (high digital signal WD) or the lowest (low digital signal WD) frequency that may be set for the same VCO, that is one among the frequencies limiting the operating range of the VCO 2, and it resets all the counters T1–Tk. When the frequency fo*S is computed by means of the S divider 13, it is counted simultaneously by all the counters T1–Tk, arranged in parallel to each other, at the step C. When any counter Ti with i=1, ... k counts the frequency fo*S with a time window number Fi different from the prefixed number Bi, it sends a reset pulse to the circuitry 10 at the step D. The circuitry 10 resets all the counters and decreases (in the case wherein the high digital signal WD has been set) or increases (in the case wherein the low digital signal WD has been set) of at least one least significant bit LSB the digital signal WD at the step E; the new frequency fo*S is counted by all the counters T1–Tk. The operation corresponding to the steps B–E is repeated more times until the frequency fo tends to coincide with the frequency fR and also the counter Tk counts the time window number $(fo*S/(fR*2^{k-1}))$ corresponding to the value Bk. In such a case, no reset signal is sent to the circuitry 10 and the circuitry 10 sets the switch 7 to connect the VCO 2 with the output signal of the filter LPF at the step F. Therefore the last counter Tk determines the precision of the calibration device 3. The PLL 1 after this instant may operate as a known PLL.

With such a method the convergence time of the calibration process is reduced for the use of various counters with different precision and with different counting time; more precisely the counters with lower precision employ a lower counting time and therefore the lasts will send to the circuitry 10 the reset pulses for the greatest part of the calibration process.

Said method, which has been described in the case wherein the device 3 comprises a plurality of counters T1–Tk, is also valid in the case wherein the device 3 comprises only one counter or two counters.

For example if it is imposed that the digital signal WD is a word with six bits and it sets initially WD=[111111], fR=32 Mhz, ft=256 Mhz, one considers k=5 and by selecting S=8 it is obtained B1=8, B2=16, B3=32, B4=64, B5=128 and imposes that the frequency fo*S corresponding to the word WD is of 335 Mhz, there will be the following situation.

The counter T1 will count 10 pulses equal to the entire number of 335/32 and because said number is higher than B1, it sends a reset pulse to the circuitry 10 which provides to reset all the counters and to decrease by a LSB the signal WD that is [111110]. Said operation with the only counter T1 will continue until fo*S=288 Mhz corresponding to the signal [100000] that is when the counter will count a number equal to 9 pulses.

The second counter T2 with WD=[100000] will count more than 17 pulses, that is a number higher than B2, and it sends a reset pulse to the circuitry 10 which provides to reset all the counters and to decrease by a LSB the signal WD that is [011111]. Said operation of the counter T2 will continue until fo*S=273 Mhz corresponding to the signal WD= [010110].

The third counter T3 with WD=[010110] will count a pulse number higher than B3 and it sends a reset pulse to the circuitry 10 which provides to reset all the counters and to decrease by a LSB the signal WD that is [010111]. Said operation with the only counter T3 will continue until fo*S=263 Mhz corresponding to the signal WD=[001111].

The fourth counter T4 with WD=[001111] will count a pulse number higher than B4 and it sends a reset pulse to the circuitry 10 which provides to reset all the counters and to decrease by a LSB the signal WD that is [001110]. In such case the counter T4 counts a pulse number higher than B4 and it will provide to decrease by a LSB the signal WD. Said operation will continue until to reach a frequency fo*S corresponding to the signal WD=[001101].

The fifth counter T5 with WD=[001101] will count a pulse number higher than B5 and it will send a reset pulse to the circuitry 10 which provides to reset all the counters and to decrease by a LSB the signal WD. Said operation of the counter T5 will continue until fo*S=265.5 Mhz corresponding to the signal WD=[001011] with which the frequency calibration process ends.

The invention claimed is:

1. A device for calibrating the frequency of an oscillator having a first and a second input and generating an output frequency as a response to a first voltage signal applied at said first input and an output digital signal applied at said second input of the oscillator for calibrating the output frequency, said calibration device comprising:

a counter having a first input frequency proportional to a reference frequency and a second input frequency proportional to the output frequency of the oscillator, said counter counting a time window number given by the ratio of the second input frequency to the first input frequency;

comparing means for comparing said counted time window number with a reference time window number; and means for changing a value of said output digital signal if said counted time window number is different from said reference time window number and until said counted time window number is equal to said reference time window number.

2. The device according to claim 1, wherein the counter is a first counter, the counted time window number is a first time window number, the comparing means are a first comparing means, and the reference time window number is a first reference time window number, the device further comprising:

a second counter placed in parallel to the first counter, the second counter having a precision higher than the first counter so that the first reference time window number for the first counter is lower than a second reference time window number for the second counter and said first input frequency has a first value for the first counter and a second value for said second counter, with said second value being lower than the first value, said first and a second counters counting simultaneously the first time window number and a second time window number, respectively, given by the ratio of the second input frequency respectively by the first value and by the second value of the first input frequency; and second comparing means for comparing said first time window number and said second time window number with the respective reference time window numbers, said means for changing including means for changing the value of said frequency calibration digital signal if one of said time window numbers is different from the respective reference time window number and until the second time window number is equal to the second reference time window number.

3. The device according to claim 1, wherein the counter is one of a succession of counters arranged in parallel to each other, each counter of said counter succession having a precision higher than a preceding one of the counters, if a preceding counter exists, and lower than a successive one of the counters, if a successive counter exists, so that a respective reference time window number of each counter is higher than a reference time window number for the preceding counter and lower than a reference time window number for the successive counter and said first frequency has a given value for each counter of the counter succession which is higher than the value for the preceding counter and lower than the value for the successive counter, each counter of said counter succession counting simultaneously a respective one of a plurality of time window numbers given by the ratio of the second frequency to the respective value of the first frequency, said comparing means comprising means for comparing said time window numbers with the respective reference time window numbers and said means for changing include means for changing the value of said output digital signal if one of said counted time window numbers is different from the respective reference time window number and until the counted time window number of a last counter of the counter succession is equal to the respective reference time window number.

4. The device according to claim 3 wherein the values of the frequency proportional to the reference frequency are given by the reference frequency divided by $2^{i-1}$, wherein i is an entire number indicating the number of the counter of said counter succession.

5. The device according to claim 4, wherein the reference time window numbers are given by a further given frequency proportional to the reference frequency divided by the values of the first frequency proportional to the reference frequency.

6. The device according to claim 3 wherein said output digital signal for calibrating the frequency of the oscillator is changed by an amount at least equal to one least significant bit when one of said counted time window numbers is different from the related reference time window number.

7. The device according to claim 3 wherein a clock signal of each counter is a single clock signal given by the inverse of the second frequency.

8. A phase looked loop circuit, comprising:

an oscillator having first and second inputs and generating an output frequency as a response to a voltage signal applied at said first input, said voltage signal being a reference voltage signal during a calibration phase;

a low-pass filter coupled to said first input of the oscillator during a phase-lock phase and structured to generate a low pass signal as the voltage signal applied to said first input during the phase-lock phase;

a phase detector that determines a phase difference between a reference frequency and a frequency deriving from the output frequency of the oscillator and generating a signal as a response to said phase difference;

a calibration device that generates a calibration signal applied at the second input of the oscillator for calibrating the output frequency, said calibration device including:

a first counter having a first input frequency proportional to said reference frequency and a second input frequency proportional to the output frequency of the oscillator, said counter counting a first time window number given by the ratio of the second to the first frequency first comparing means for comparing said first time window number with a first reference time window number; and means for changing a value of said calibration signal if said first time window number is different from said first reference time window number and until said first time window number is equal to said first reference time window number.

9. The circuit according to claim 8, wherein said calibration device further includes;

a second counter placed in parallel to the first counter, the second counter having a precision higher than the first counter so that the first reference time window number for the first counter is lower than a second reference time window number for the second counter and said first input frequency has a first value for the first counter and a second value for said second counter, with said second value lower than the first value, said first and a second counters counting simultaneously the first time window number and a second time window number given by the ratio of the second input frequency respectively to the first value and to the second value of the first input frequency; and second comparing means for comparing said first time window number and said second time window number with the respective reference time window numbers, said means for changing including means for changing the value of said calibration signal if one of said time window numbers is different from the respective reference time window number and until the second time window number is equal to the respective reference time window number.

10. The circuit according to claim 8, wherein the first counter is one of a succession of counters arranged in parallel to each other, each counter of said counter succession having a precision higher than a preceding one of the counters, if a preceding counter exists, and lower than a successive one of the counters, if a successive counter exists, so that a respective reference time window number of each counter is higher than a reference time period number for the preceding counter and lower than a reference time period number for the successive counter and said first frequency has a given value for each counter of the counter succession which is higher than the value for the preceding counter and lower than the value for the successive counter, each counter of said counter succession counting simultaneously a respective one of a plurality of time window numbers given by the ratio of the second frequency to the respective value of the first frequency, said comparing means comprising means for comparing said numbers with the respective reference time window numbers and said means for changing include means for changing the value of said calibration signal if one of said counted time window numbers is different from the respective reference time window number and until the counted time window number of a last counter of the counter succession is equal to the respective reference time window number.

11. The circuit according to claim 10, wherein the values of the frequency proportional to the reference frequency are given by the reference frequency divided by $2^{i-1}$, wherein i is an entire number indicating the number of the counter of said counter succession.

12. The circuit according to claim 11, wherein the reference time window numbers are given by a further given frequency proportional to the reference frequency divided by the values of the first frequency proportional to the reference frequency.

13. The circuit according to claim 10 wherein said calibration signal for calibrating the frequency of the oscillator is changed by an amount equal to at least one least significant bit when one of said counted time window numbers is different from the related reference time window number.

14. The circuit according to claim 10 wherein a clock signal of each counter is a single clock signal given by the inverse of the second frequency.

15. The circuit according to claim 8, further comprising a switch controlled by said calibration device and structured to couple said oscillator with said low-pass filter or with said reference voltage signal.

16. The circuit according to claim 8, further comprising a charge pump arranged between said phase detector and said low-pass filter.

17. A method for calibrating a frequency of an oscillator belonging to a phase looked loop circuit, said method comprising applying a reference voltage signal at a first input of the oscillator;

generating a calibration signal applied at a second input of the oscillator;

generating an output frequency of the oscillator depending on the applied calibration signal;

counting a time window number given by a ratio of a first input frequency, proportional to a reference frequency, to a second input frequency proportional to the output frequency of the oscillator; comparing said time window number with a reference time window number; and changing the value of said calibration signal if said counted time window number is different from said reference time window number and until said counted time window number is equal to said reference time window number.

18. The method according to claim 17, wherein said oscillator has a operating frequency range and said generating the calibration signal comprises setting a value of said calibration signal to a highest or lowest value among the values within said frequency range of operation of the oscillator.

19. The method according to claim 17, wherein said calibration signal for calibrating the frequency of the oscillator is changed by an amount equal to a least significant bit when said counted time window number is different from the reference time window number.

* * * * *